(12) United States Patent
Ku et al.

(10) Patent No.: US 11,563,107 B2
(45) Date of Patent: Jan. 24, 2023

(54) METHOD OF CONTACT PATTERNING OF THIN FILM TRANSISTORS FOR EMBEDDED DRAM USING A MULTI-LAYER HARDMASK

(71) Applicant: Intel Corporation, Santa Clara, CA (US)

(72) Inventors: Chieh-Jen Ku, Hillsboro, OR (US); Bernhard Sell, Portland, OR (US); Pei-Hua Wang, Beaverton, OR (US); Nikhil Mehta, Portland, OR (US); Shu Zhou, Portland, OR (US); Jared Stoeger, Portland, OR (US); Allen B. Gardiner, Portland, OR (US); Akash Garg, Portland, OR (US); Shem Ogadhoh, Beaverton, OR (US); Vinaykumar Hadagali, Portland, OR (US); Travis W. Lajoie, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 795 days.

(21) Appl. No.: 16/361,881

(22) Filed: Mar. 22, 2019

(65) Prior Publication Data

US 2020/0303520 A1 Sep. 24, 2020

(51) Int. Cl.
*H01L 29/66* (2006.01)
*H01L 27/108* (2006.01)
*H01L 29/786* (2006.01)

(52) U.S. Cl.
CPC .. *H01L 29/66742* (2013.01); *H01L 27/10805* (2013.01); *H01L 27/10873* (2013.01); *H01L 29/78696* (2013.01)

(58) Field of Classification Search
None
See application file for complete search history.

(56) References Cited

U.S. PATENT DOCUMENTS

2003/0129847 A1  7/2003  Celii

FOREIGN PATENT DOCUMENTS

WO  WO 2018/111247  6/2018
WO  WO 2018/182607  10/2018
(Continued)

OTHER PUBLICATIONS

Onuki, Tatsuya, et al. "Embedded Memory and ARM Cortex-M0 Core Using 60-Nm c-Axis Aligned Crystalline Indium-Gallium-Zinc Oxide FET Integrated with 65-Nm Si CMOS." IEEE Journal of Solid-State Circuits, vol. 52, No. 4, 2017, pp. 925-932., https://doi.org/10.1109/jssc.2016.2632303. (Year: 2017).*

(Continued)

*Primary Examiner* — J. E. Schoenholtz
(74) *Attorney, Agent, or Firm* — Schwabe, Williamson & Wyatt, P.C.

(57) ABSTRACT

An integrated circuit structure comprises one or more back-end-of-line (BEOL) interconnects formed over a first ILD layer. An etch stop layer is over the one or more BEOL interconnects, the etch stop layer having a plurality of vias that are in contact with the one or more BEOL interconnects. An array of BEOL thin-film-transistors (TFTs) is over the etch stop layer, wherein adjacent ones of the BEOL TFTs are separated by isolation trench regions. The TFTs are aligned with at least one of the plurality of vias to connect to the one or more BEOL interconnects, wherein each of the BEOL TFTs comprise a bottom gate electrode, a gate dielectric layer over the bottom gate electrode, and an oxide-based semiconductor channel layer over the bottom gate electrode having source and drain regions therein. Contacts are (Continued)

formed over the source and drain regions of each of BEOL TFTs, wherein the contacts have a critical dimension of 35 nm or less, and wherein the BEOL TFTs have an absence of diluted hydro-fluoride (DHF).

25 Claims, 11 Drawing Sheets

(56) References Cited

FOREIGN PATENT DOCUMENTS

| WO | WO 2018/182711 | 10/2018 |
| WO | WO 2018/182738 | 10/2018 |
| WO | WO-2018182607 A1 * | 10/2018 |

OTHER PUBLICATIONS

Search Report from European Patent Application No. 20158343.2, dated Jul. 16, 2020, 9 pgs.

* cited by examiner

METHOD OF CONTACT PATTERNING OF THIN FILM TRANSISTORS FOR EMBEDDED DRAM USING A MULTI-LAYER HARDMASK

TECHNICAL FIELD

Embodiments of the disclosure are in the field of integrated circuit structures and, in particular, contact patterning of thin film transistors for embedded DRAM using a multi-layer hardmask.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as contacts and vias, to electrically connect metal lines or structures. Contacts and vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the contact/via may be etched in the dielectric layer by using the opening in the photoresist layer as an etch mask. The opening may be then filled with one or more metals or other conductive materials to form the contact and/or via.

In the past, the sizes and the spacing of contacts has progressively decreased, and it is expected that in the future the sizes and the spacing of the contacts will continue to progressively decrease, for at least some types of integrated circuits (e.g., advanced microprocessors, chipset components, graphics chips, etc.). One measure of the size of the contacts is the critical dimension of the contact opening. One measure of the spacing of the contacts is the contact pitch, representing the center-to-center distance between the closest adjacent contact.

When patterning extremely small contacts with extremely small pitches by such lithographic processes, several challenges present themselves, especially when the pitches are around 70 nanometers (nm) or less and/or when the critical dimensions of the contact openings are around 35 nm or less. One such challenge is that the critical dimensions of the contact openings generally tend to scale faster than the resolution capabilities of the lithographic scanners. Shrink technologies exist to shrink the critical dimensions of the contact openings. However, the shrink amount tends to be limited by the minimum contact pitch, as well as by the ability of the shrink process to be sufficiently optical proximity correction (OPC) neutral, and to not significantly compromise critical dimension uniformity (CDU).

Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1:
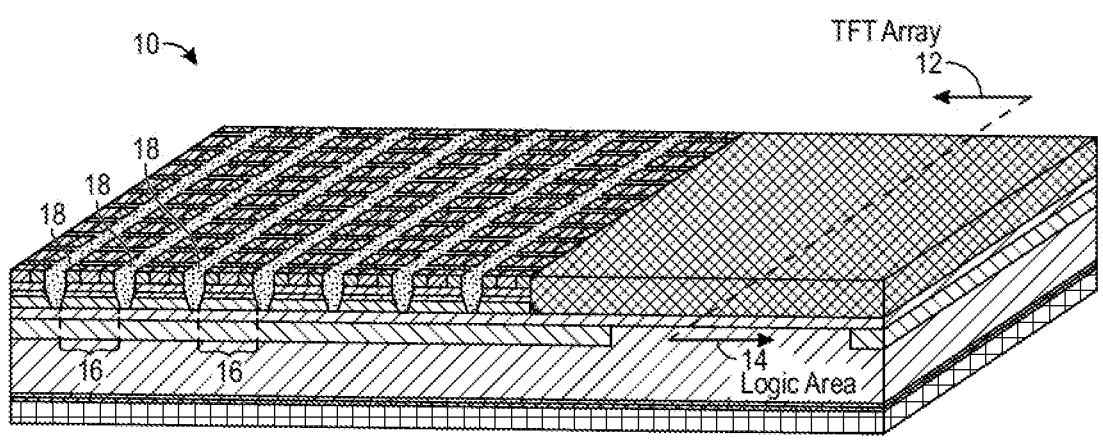
FIG. 1 is a diagram illustrating a cross-sectional view taken along a gate "width" of a conventional thin film integrated circuit structure.

Methods for contact patterning of thin film transistors for embedded DRAM using a multi-layer hardmask are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to structures and architectures for fabricating contacts of thin film transistors for embedded DRAM using a multi-layer hardmask. Embodiments may include or pertain to one or more of backend transistors, thin film transistors, semiconducting oxide materials, thin film transistors, and system-on-chip (SoC) technologies. One or more embodiments may be implemented to realize high performance backend transistors potentially to increase monolithic integration of backend logic plus memory in SoCs of future technology nodes.

To provide context, an embedded dynamic random access memory (eDRAM) is a capacitor-based dynamic random access memory usually integrated on the same die or in the same package as the main ASIC or processor, as opposed to external DRAM modules and transistor-based SRAM typically used for caches. EDRAM has its memory cells and its logic cells formed on a single silicon chip. Due to its high memory capacity and speed, eDRAM has been used inside high volume processing circuits, an example of which is a graphic processor. A complete eDRAM includes logic circuits, a transfer field effect transistor (transfer FET) and a capacitor coupled to the transfer FET. The transfer FET acts as a switch between a lower electrode of the capacitor and a bit line. Therefore, data within the capacitor can be written in or read out. In previous technology nodes, such as a 22 nanometer FinFet technology, the eDRAM incorporated transfer FETs in the FOEL and could only achieve 256 MG of storage.

FIG. 1 is a diagram illustrating an angled view of an improved eDRAM 10 according to the disclosed embodiments. The eDRAM of the disclosed embodiments replaces transfer FETs with smaller thin film transistors (TFTs) having an oxide-based semiconductor channel layer to meet new density requirements. Accordingly, the eDRAM 10 comprises a TFT array 12 adjacent to a logic area 14, where the TFT array 12 includes rows and columns of TFTs, shown as BEOL oxide-based TFTs 16, which are separated by isolation trench regions 18. In one embodiment, both the BEOL oxide-based TFTs 16 and corresponding capacitors (not shown) are fabricated in the BEOL and do not take away from the footprint in the FEOL. Consequently, the oxide based TFT eDRAM array 10 has a reduced transistor footprint to enable a gigabyte memory capacity.

When fabricating the TFT array 12, the use of the BEOL oxide-based TFTs 16 poses fabrication challenges. One challenge is patterning source and drain contacts for the oxide-based TFTs 16 since CD/Pitches are different in the TFT array in a parallel-to-gate direction (PGD) and in an orthogonal-to-gate direction (OGD) with tight CD windows. Another challenge is that during normal fabrication and patterning of a traditional eDRAM having transfer FETs, a BEOL dielectric hardmask is utilized that must be removed with a wet clean process that uses diluted hydro-fluoride (DHF). Unfortunately, if the DHF-based wet clean process were used during fabrication of an eDRAM having embedded BOEL oxide-based TFTs 16, the DFH would completely remove the oxide forming the semiconductor channel layer. Thus, the DHF-based wet clean process is not compatible with fabrication of BOEL oxide-based TFTs 16.

In general, one or more embodiments are directed to an approach that employs a multilayer hardmask for contact patterning of BEOL oxide-based TFTs for an eDRAM. The multilayer hardmask is used in conjunction with a litho-etch-litho-etch patterning process to enable two different dry etch bias tunings; one etch bias tuning for the parallel-to-gate direction (PGD) and a second etch bias tuning for the orthogonal-to-gate direction (OGD). Because the dry etch processes replace the wet etch process, the use of DHF is not required. An eDRAM fabricated using such an architecture may exhibit TFT contacts having tight CD windows in addition to different CD/pitch requirements in both PGD and OGD. Applications of such systems may include, but are not limited to, backend (BEOL) memory, logic, or analog applications.

Figure 2A:
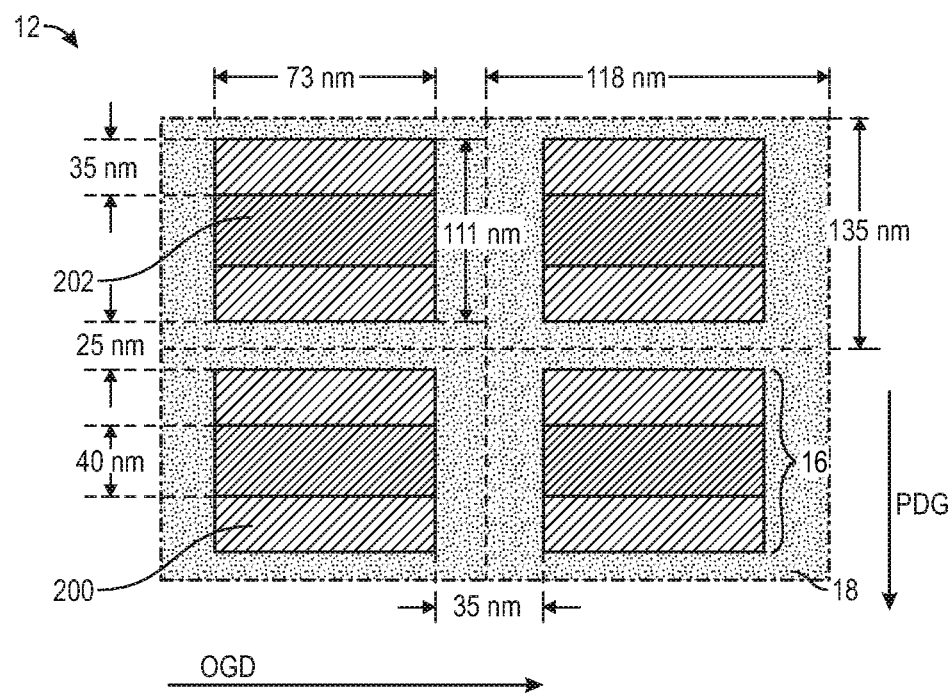
FIGS. 2A and 2B are diagrams illustrating a top layout and cross-sectional views, respectively, of an eDRAM integrated circuit structure.
Figure 2B:
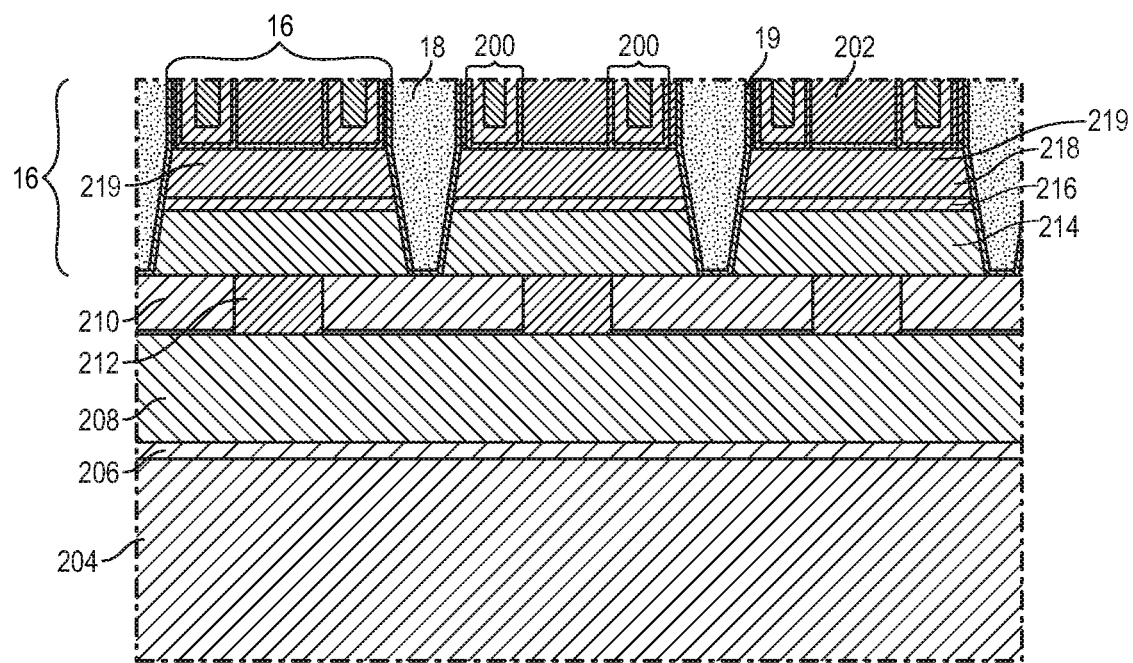

Before describing the process for fabricating contacts of the BOEL oxide-based TFTs 16 for the eDRAM 10, refer now to FIGS. 2A and 2B illustrating a top layout and cross-sectional views, respectively, of an eDRAM integrated circuit structure.

FIG. 2A is a diagram illustrating a top view layout of a portion of the TFT array 12 in which individual BEOL oxide-based TFTs 16 are arranged in a grid. The only transistor structures viewable in the top view layout are contacts 200 of the transistor source/drain (not shown) and a transistor interlayer dielectric (ILD) 202 (e.g., SiN) between the contacts 200 that encapsulate the active area or channel region of each BEOL oxide-based TFT 16. Isolation regions 18 separate and isolate the BEOL oxide-based TFTs 16 in the TFT array 12. The parallel-to-gate direction (PGD) and orthogonal-to-gate direction (OGD) are also shown.

FIG. 2B is a diagram illustrating a cross-section view along the parallel-to-gate direction (PGD) of a portion of the TFT array 12. According to the disclosed embodiments, the TFT array of the eDRAM 10 includes one or more BEOL interconnects 208 formed over a low-k ILD layer 204. In one embodiment, the low-k ILD layer 204 may be located at a via N-1 level, and the BEOL interconnect 208 may comprise copper and may be located at a metal N level. A barrier layer 206 for the copper-based BEOL interconnect may be located between the low-k ILD 204 and the BEOL interconnect 208 to prevent leaching of the copper.

An etch stop layer 210 is over the BEOL interconnects 208, and includes a plurality of vias 212 that contact with the one or more BEOL interconnects 208. A plurality of BEOL oxide-based TFTs 16 are formed over the etch stop layer 210, where adjacent ones of the BEOL oxide-based TFTs 16 are separated by isolation trench regions 18. Each of the BEOL oxide-based TFTs 16 are aligned with at least one of the plurality of vias 212 to connect to the one or more BEOL interconnects 208. In one embodiment, at least a portion of the oxide-based TFTs 16 comprises a bottom gate electrode 214, a gate dielectric layer 216 over the bottom gate electrode 214, and an oxide-based semiconductor channel layer 218 over the bottom gate electrode 214 having source and drain regions 219 therein.

According to one aspect of the disclosed embodiments, the oxide-based semiconductor channel layer 218 may comprise tin oxide, antimony oxide, indium oxide, indium tin oxide, indium gallium zinc oxide (IGZO), titanium oxide, zinc oxide, indium zinc oxide, gallium oxide, titanium oxynitride, ruthenium oxide or tungsten oxide. The gate dielectric layer 216 may comprise a high-k material such as zirconium oxide, hafnium oxide, aluminum oxide, or silicon oxide. In one embodiment, the bottom gate electrode 214 may comprise metals including titanium nitride, tungsten or tantalum nitride.

Contacts 200 are formed over source and drain regions of each of the oxide-based TFTs 16 and the transistor ILD 202 is formed between the contacts 200. In one embodiment, the contacts 200 may be formed by a single metal layer, or by a plurality of metal layers (e.g., two metal layers are depicted).

As shown in FIG. 2A, in one embodiment, the contacts 200 have a critical dimension (CD) of approximately 35 nm or less in the PGD. In one embodiment, the TFT pitch in PGD is approximately 135 nm in a particular embodiment, or in general approximately 120-150 nm. In one embodiment the TFT pitch in the OGD is approximately 118 nm in a particular embodiment, or in general approximately 93-123 nm. The transistor ILD 202 has a CD of approximately 40 nm or less. Individual BEOL oxide-based TFTs 16 are approximately 111 nm in the PGD in a particular embodiment, or in general 95-125 nm in size. The oxide-based TFTs 16 are approximately 73 nm in the OGD in a particular embodiment, or generally approximately 58-88 nm. The oxide-based TFTs 16 are spaced apart in the PGD by approximately 25 nm or less, and are spaced apart in the OGD by approximately 35 nm or less.

In one aspect, the use of a wet clean process is eliminated during fabrication of the eDRAM 10 to preserve the oxide-based semiconductor channel layer 218. Instead, the wet clean process is replaced with a multilayer hardmask and a litho-etch-litho-etch patterning process, which are dry etch processes. Thus, an XTEM (cross-sectional transmission electron microscope) image of the eDRAM 10 will reveal that the oxide-based TFTs 16 of the disclosed embodiments are absent of diluted hydro-fluoride (DHF).

According to the disclosed embodiments, a contact fabrication process that does not use DHF is described to enable patterning of contacts 200 of the eDRAM 10 even as sizes and the spacing of contacts has progressively decreased to the tight CDs and pitches described above.

Figure 3:
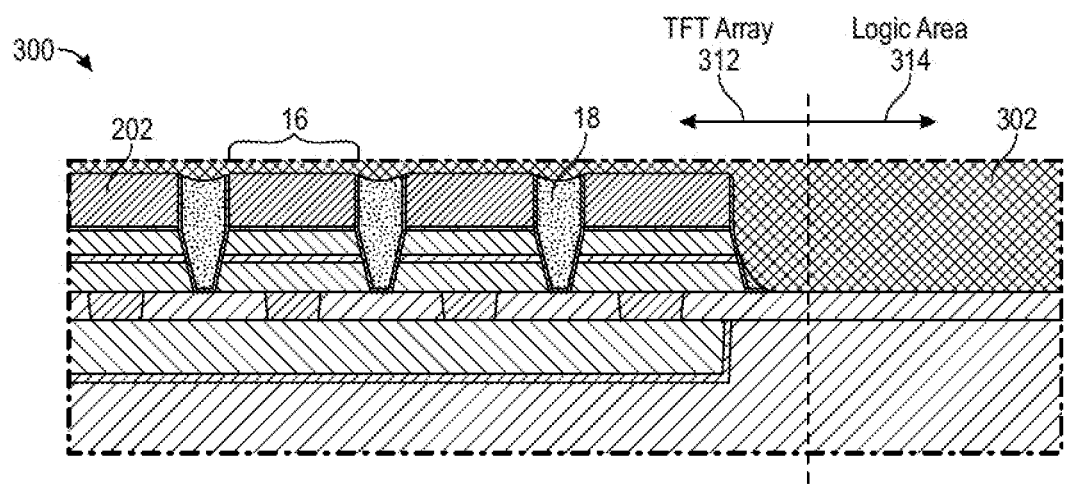
FIG. 3 is a diagram illustrating a cross-section view along the parallel gate direction (PGD) of the fabrication state the eDRAM as input to the contact fabrication process of the disclosed embodiments.

FIG. 3 is a diagram illustrating a cross-section view along the parallel gate direction (PGD) of the fabrication state the eDRAM 300 that is input to the contact fabrication process of the disclosed embodiments. The contact fabrication process begins after an array of BEOL oxide-based TFTs 16 is patterned over one or more BEOL interconnects. In one embodiment, BEOL oxide-based TFTs 16 patterning includes encapsulating the channel regions of the BEOL oxide-based TFTs 16 with the transistor ILD 202, performing an isolation gap filling process to form the isolation regions 18, and forming a second low-k ILD layer 302 over TFT array 312 and the logic area 314.

FIGS. 4A-4H are diagrams illustrating angled views of the TFT array 312 during stages of the contact patterning process. Given eDRAM 300 as input as the starting point, the process may begin by forming a multilayer hardmask for contact patterning of the BEOL oxide-based TFTs, where the multilayer hardmask comprises a metal hardmask HM1 and a dielectric hardmask HM2 with different etch selectivities.

Figure 4A:
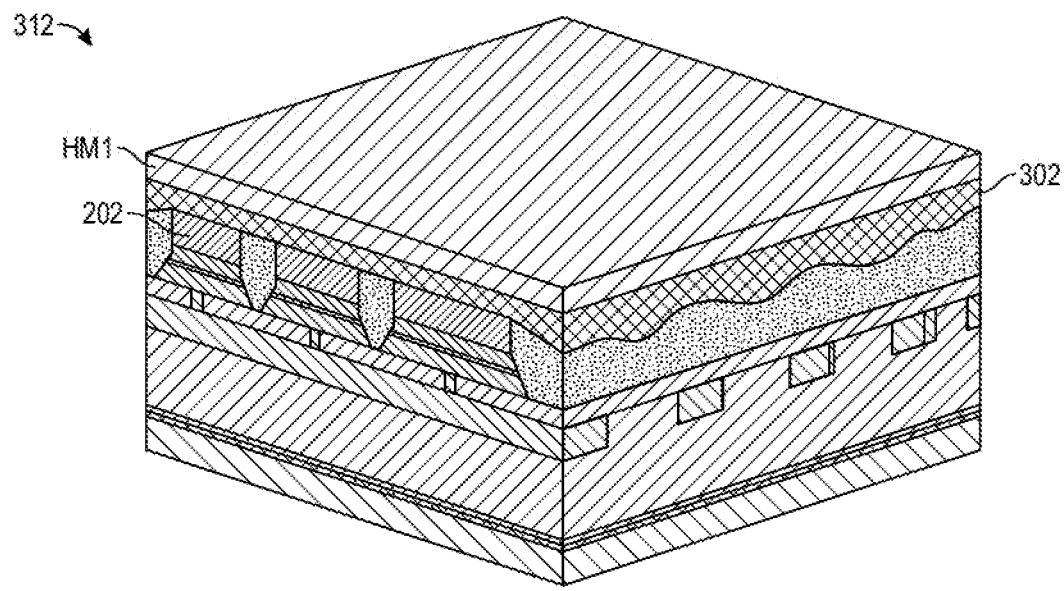
FIGS. 4A-4H are diagrams illustrating angled views of the TFT array during stages of the contact patterning process.
Figure 4B:
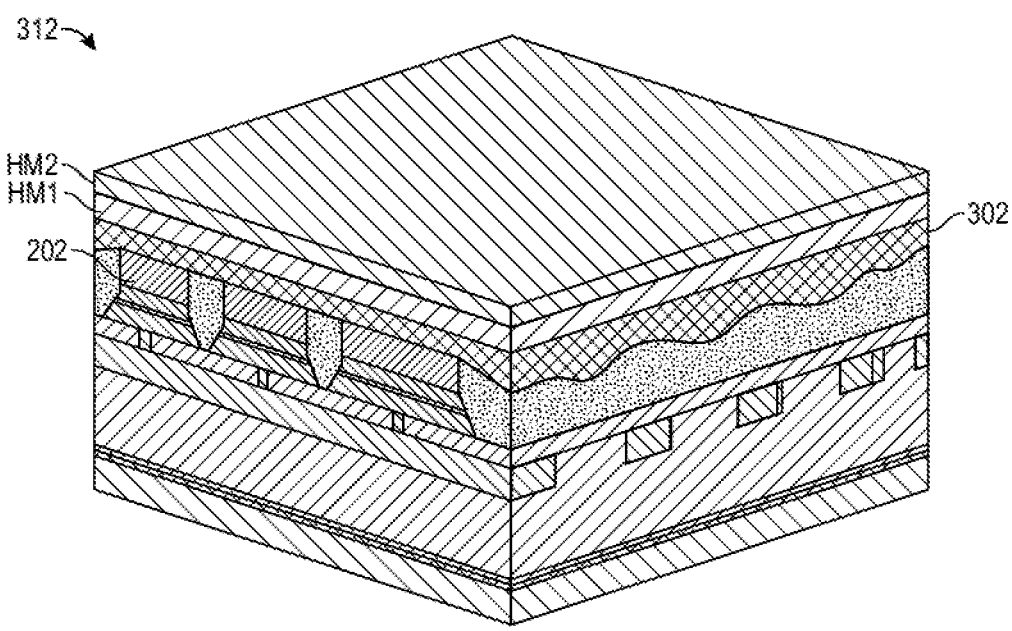

FIG. 4A is a diagram illustrating the TFT array 312 after formation of the metal hardmask HM1 over the second low-k ILD layer 302. FIG. 4B shows the TFT array 312 after formation of the dielectric hardmask HM2 over the metal hardmask HM1.

In one embodiment, the metal hardmask HM1 and the dielectric hardmask HM2 may be formed by any deposition technique such as CVD, PVD or ALD. In one embodiment, the metal hardmask HM1 is approximately 10-35 nm in thickness and the dielectric hardmask HM2 is approximately 10-30 nm in thickness. In one embodiment, the metal hardmask HM1 and the dielectric hardmask HM2 may be formed with a single material layer or a plurality of materials layers, and the number of material layers comprising the metal hardmask HM1 may be the same or different than the number of material layers comprising the dielectric hardmask HM2.

According to the disclosed embodiments, after formation of the metal hardmask HM1 and the dielectric hardmask HM2, two separate lithographic etch patterning processes are performed, which together are referred to herein as a litho-etch-litho-etch patterning process. The litho-etch-litho-etch patterning process enables two different etch bias tunings; one etch bias tuning for patterning the dielectric hardmask HM2 in the orthogonal-to-gate direction (OGD), and a second etch bias tuning for patterning the metal hardmask HM1 in the parallel-to-gate direction (PGD) to define contact hole locations and dimensions.

Figure 4C:
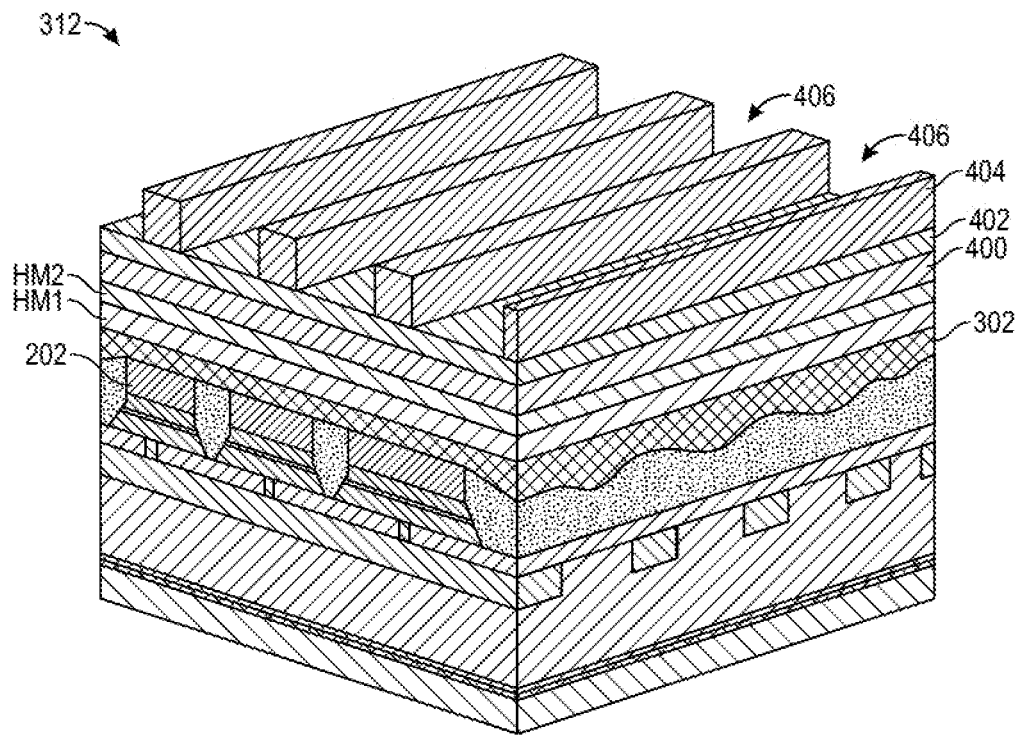

FIG. 4C is a diagram illustrating the TFT array 312 after the first lithographic etch process is used to define a first pattern in the OGD to transfer to dielectric hardmask HM2. In one embodiment, the first lithographic etch process may be implemented by forming a first carbon hardmask (CHM) 400 over the dielectric hardmask HM2, and forming a first silica anti-reflection coating (ARC) 402 over the first CHM 400 to further planarize the surface of TFT array 312 for improved topography. A first resist mask 404 is patterned over the first silica ARC 402 to define trenches 406 parallel to the OGD, where the first pattern will be transferred to dielectric hardmask HM2 via a first contact dry etch. The first resist mask 404 is patterned to cover the active area or channel region of each BEOL oxide-based TFT 16, which are under transistor ILD 202 shown in FIG. 2A, to eventually expose locations for the contacts 200 in the OGD.

Figure 4D:
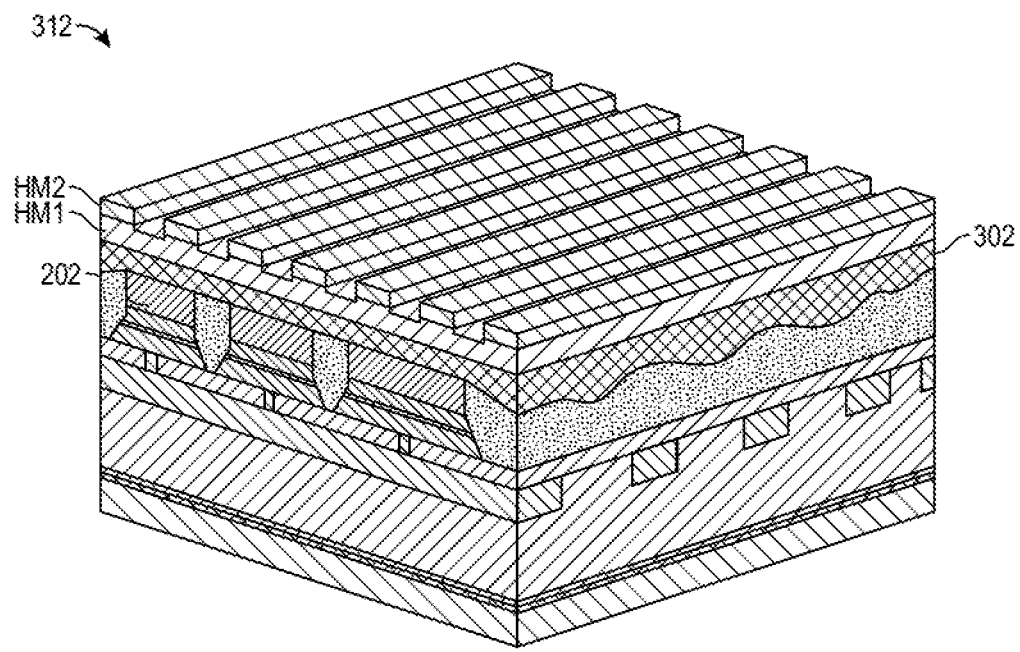

FIG. 4D shows the TFT array 312 after the first pattern in the OGD defined by the first resist mask 404 is transferred to the dielectric hardmask HM2 by a first contact dry etch process. The first contact dry etch process has a chemistry selective to metal hardmask HM1 and non-selective to dielectric hardmask HM2 so that the first contact dry etch process removes the dielectric hardmask HM2 over intended contact hole locations in the OGD. FIG. 4D also shows the TFT array 312 after removal of the first resist mask 404, the first silica ARC 402, and the first CHM 400.

In one embodiment, to transfer the first pattern to the dielectric hardmask HM2 and to obtain the tight CDs of the contact holes, any type of multiple patterning technique, such as pitch doubling or quadruple pitch doubling, may be used to pattern the first resist mask 404 shown in FIG. 4C with enhanced feature density, as shown in FIG. 4D. One example of a multiple patterning technique may be found in U.S. Pat. No. 9,236,342, issued on Jan. 12, 2016, and assigned to the assignee of the present disclosure.

Figure 4E:
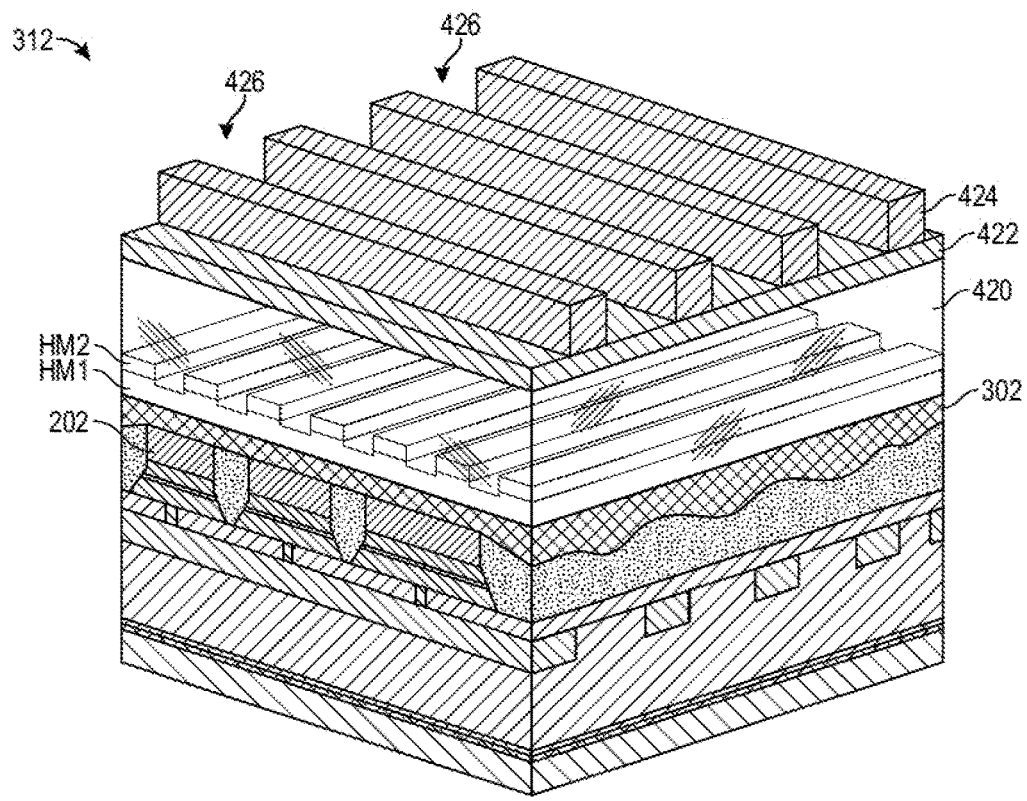

FIG. 4E shows the TFT array 312 after a second lithographic etch process is performed to define a second pattern in the PGD to transfer to the metal hardmask HM1. In one embodiment, the second lithographic etch process may be implemented by forming a second carbon hardmask (CHM) 420 over the dielectric hardmask HM2, and forming a second silica anti-reflection coating (ARC) 422 over the second CHM 420 to further planarize the surface of TFT array 312 for improved topography. A second resist mask 424 is then patterned over the second silica ARC 422 to define trenches 426 parallel to the PGD, where the second pattern will be transferred to metal hardmask HM1 via a second contact dry etch.

Similar to the first pattern, to transfer the second pattern to the metal hardmask HM1 and to obtain tight CDs of the contact holes, any type of multiple patterning technique, such as pitch doubling or quadruple pitch doubling, may be used to pattern the second resist mask as described above. The second CHM 420 is shown transparent to show that the first pattern in dielectric hardmask HM2 and the second pattern defined in the second resist mask 424 that will transferred to metal hardmask HM1 are orthogonal to one another.

Figure 4F:
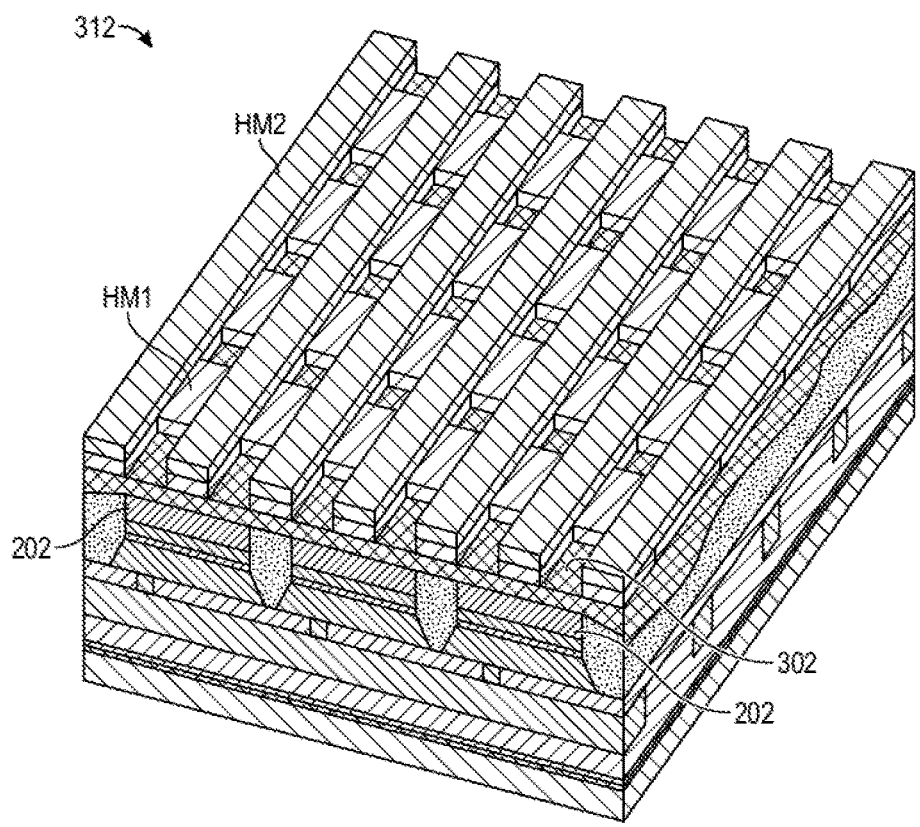

FIG. 4F shows the TFT array 312 after the second pattern in the PGD defined by the second resist mask 424 is transferred to the metal hardmask HM1 by the second contact dry etch process. The second contact dry etch process has a chemistry selective to dielectric hardmask HM2 and non-selective to metal hardmask HM1 so that the second contact dry etch process removes the metal hardmask HM1 over intended contact hole locations in the PGD. FIG. 4F also shows the TFT array 312 after removal of the second resist mask 424, the second silica ARC 422, and the second CHM 420. After the second contact dry etch process, the second low-k ILD layer 302 is exposed over what will become the contact hole locations. In one embodiment, the dielectric hardmask HM2 and the second low-k ILD layer 302 may comprise similar materials, such as TiN for example, and due to the selectivity of the second contact dry etch, neither is affected by the second contact dry etch.

Figure 4G:
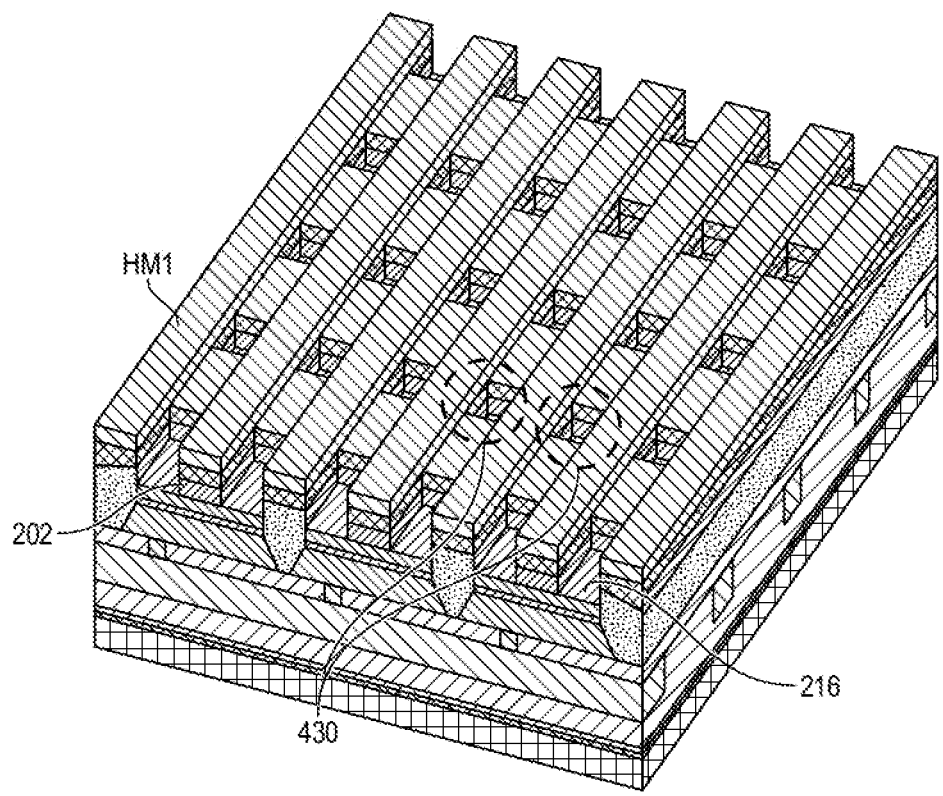

FIG. 4G shows the TFT array 312 after a contact open dry etch process is performed to remove the dielectric hardmask HM2 entirely, leaving a cross-hatched patterned metal hardmask HM1, and to remove the second low-k ILD layer 302 and the transistor ILD 202 in the contact hole locations down to the gate dielectric layer 216 to create S/D contact holes 430. In one embodiment, the contacts may be created using materials such as tungsten, copper, tantalum nitride, or any material providing an N-type connectivity.

Figure 4H:
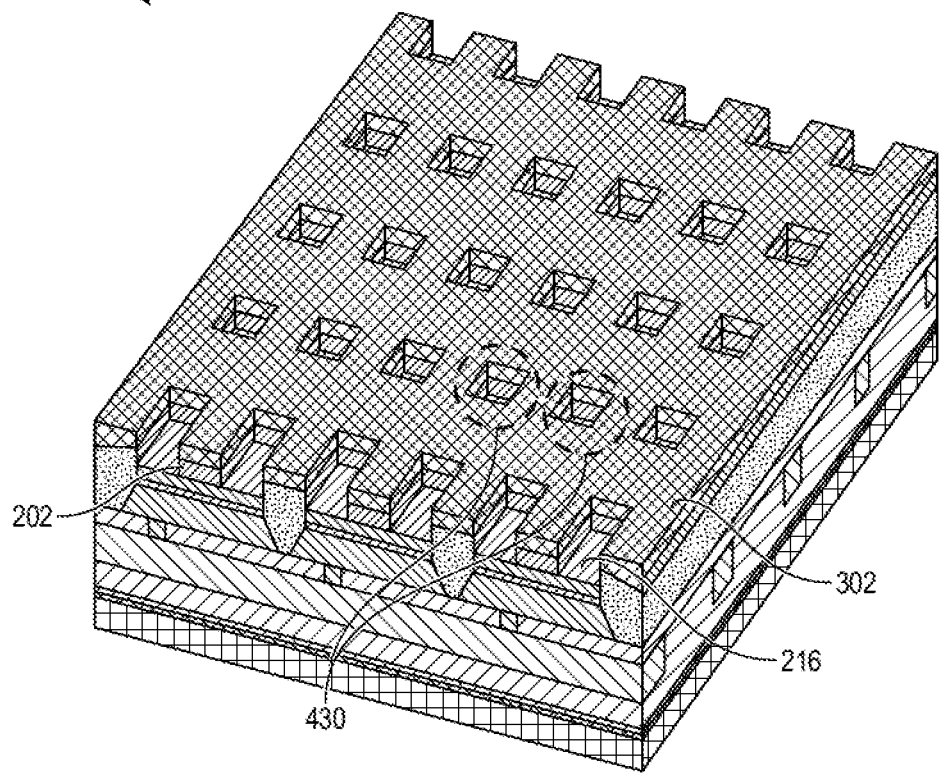

FIG. 4H shows the TFT array 312 after a wet clean process is performed to remove the metal hardmask HM1, which exposes the second low-k ILD layer 302. The wet clean that removes the metal hardmask HM1 is compatible with the oxide channel such that the wet etch does not remove or damage the oxide channel since this wet clean process does not utilize diluted hydro-fluoride (DHF). The S/D contact holes 430 are now ready for metal fill and polish to create the contacts 200.

Figure 5:
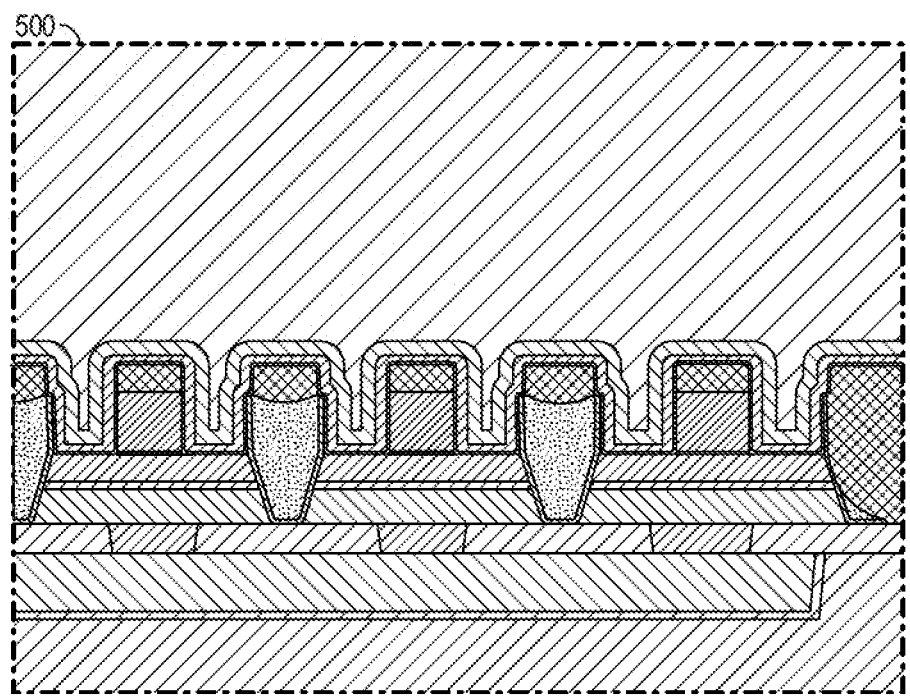
FIG. 5 is a diagram illustrating a cross-section view of the TFT array during a metal fill and polish process.

FIG. 5 is a diagram illustrating a cross-section view of the TFT array during the metal fill and polish process after a transistor contact metal fill is performed in which a metal 500, such as tungsten or copper is formed over the TFT array and overfills the contact holes. Referring again to FIG. 2B, a cross-section view of the TFT array is shown after a contact polish is performed on the metal fill to form the contacts 200. The TFT array 312 is then covered with another ILD layer (not shown) to form the final TFT array.

The integrated circuit structures described herein may be included in an electronic device. As an example of one such apparatus, FIGS. 6A and 6B are top views of a wafer and dies that include one or more contacts for thin film transistors patterned with a multilayer hardmask, in accordance with one or more of the embodiments disclosed herein.

Figure 6B:
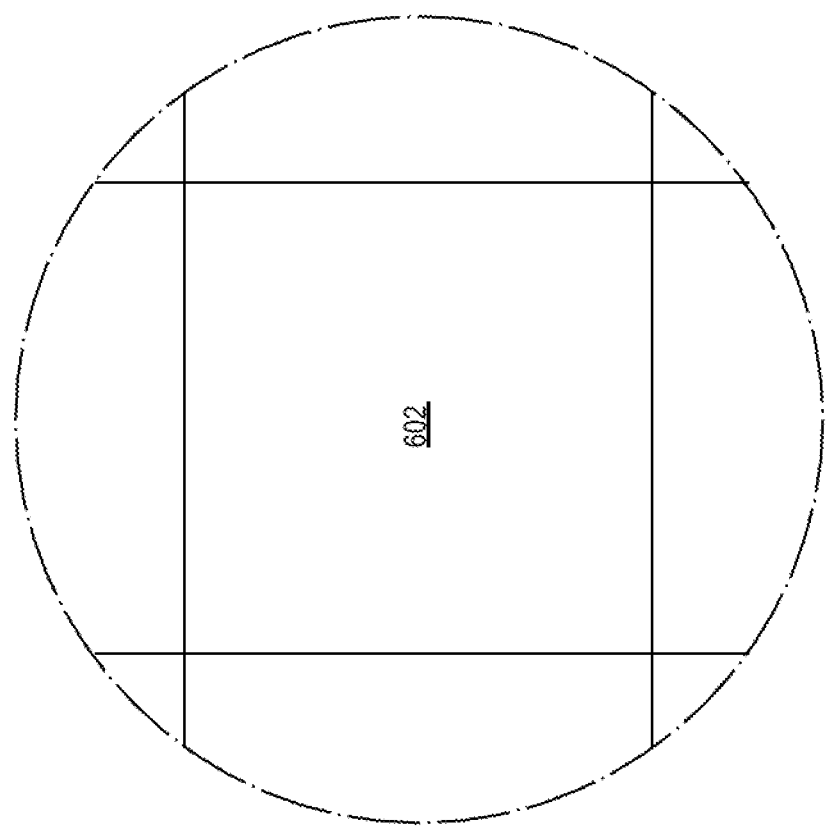
FIGS. 6A and 6B are top views of a wafer and dies that include one or more contacts for thin film transistors patterned with a multilayer hardmask, in accordance with one or more of the embodiments disclosed herein.
Figure 6A:
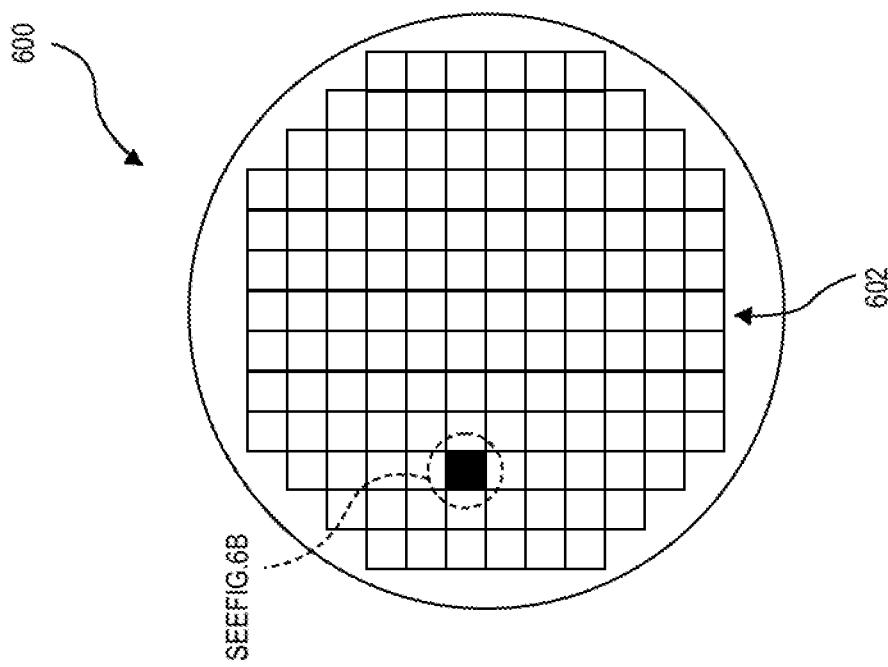

Referring to FIGS. 6A and 6B, a wafer 600 may be composed of semiconductor material and may include one or more dies 602 having integrated circuit (IC) structures formed on a surface of the wafer 600. Each of the dies 602 may be a repeating unit of a semiconductor product that includes any suitable IC (e.g., ICs including one or more contacts for thin film transistors patterned with a multilayer hardmask, such as described above. After the fabrication of the semiconductor product is complete, the wafer 600 may undergo a singulation process in which each of the dies 602 is separated from one another to provide discrete "chips" of the semiconductor product. In particular, structures that include embedded non-volatile memory structures having an independently scaled selector as disclosed herein may take the form of the wafer 600 (e.g., not singulated) or the form of the die 602 (e.g., singulated). The die 602 may include one or more embedded non-volatile memory structures based independently scaled selectors and/or supporting circuitry to route electrical signals, as well as any other IC components. In some embodiments, the wafer 600 or the die 602 may include an additional memory device (e.g., a static random access memory (SRAM) device), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
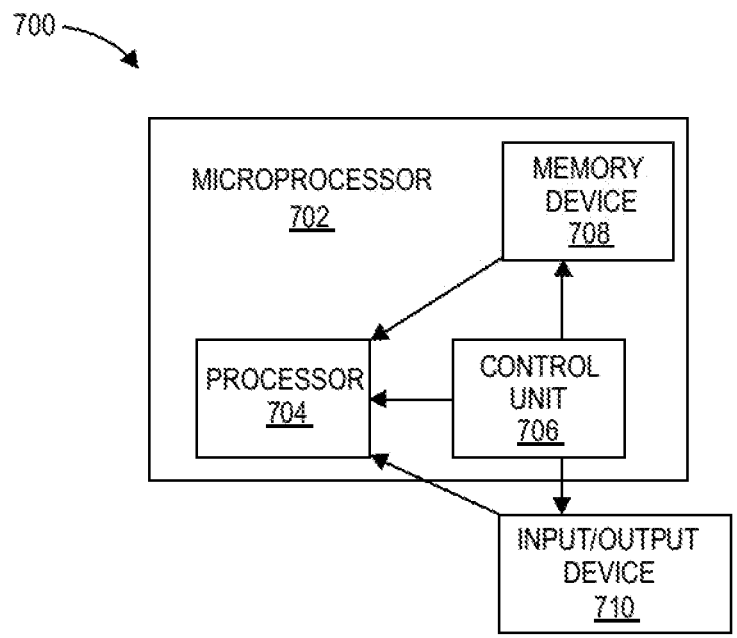
FIG. 7 is a block diagram of an electronic system, in accordance with an embodiment of the present disclosure.

FIG. 7 illustrates a block diagram of an electronic system 700, in accordance with an embodiment of the present disclosure. The electronic system 700 can correspond to, for example, a portable system, a computer system, a process control system, or any other system that utilizes a processor and an associated memory. The electronic system 700 may include a microprocessor 702 (having a processor 704 and control unit 706), a memory device 708, and an input/output device 710 (it is to be appreciated that the electronic system 700 may have a plurality of processors, control units, memory device units and/or input/output devices in various embodiments). In one embodiment, the electronic system 700 has a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a non-volatile memory cell as described in the present description. In an embodiment, the memory device 708 is embedded in the microprocessor 702, as depicted in FIG. 7. In an embodiment, the processor 704, or another component of electronic system 700, includes one or more contacts for thin film transistors patterned with a multilayer hardmask, such as those described herein.

Figure 8:
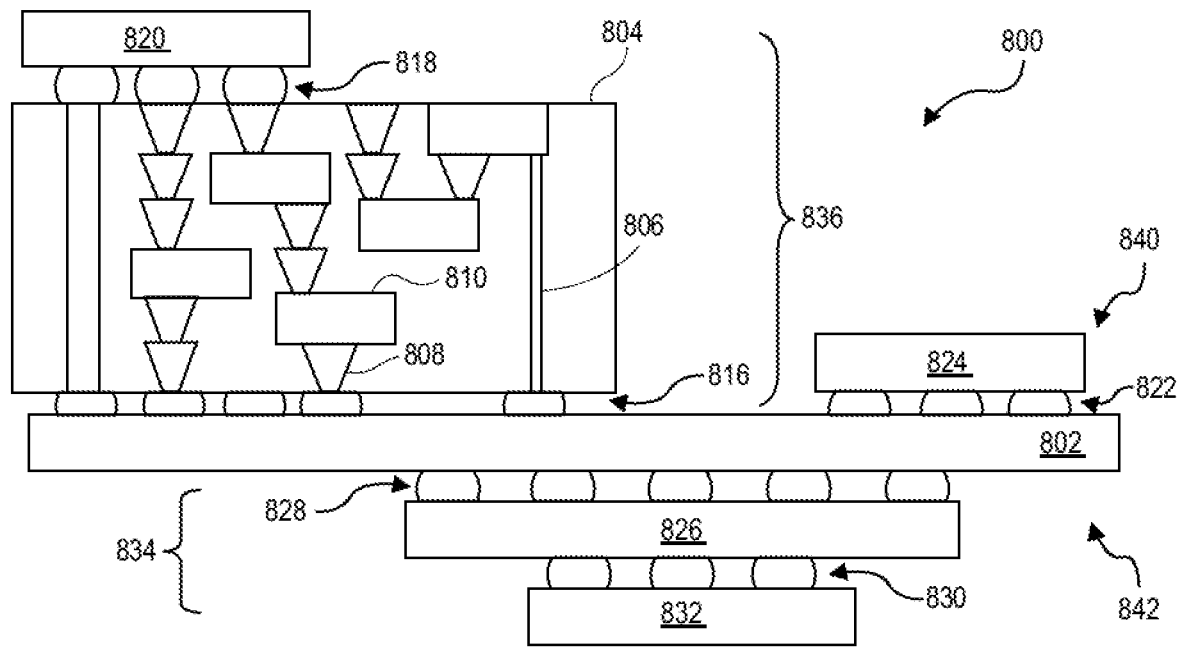
FIG. 8 is an illustration of a cross-sectional side view of an integrated circuit (IC) device assembly that may include one or more contacts for thin film transistors patterned with a multilayer hardmask, in accordance with one or more of the embodiments disclosed herein.

FIG. 8 is a diagram illustrating a cross-sectional side view of an integrated circuit (IC) device assembly that may include one or more contacts for thin film transistors patterned with a multilayer hardmask, in accordance with one or more of the embodiments disclosed herein.

Referring to FIG. 8, an IC device assembly 800 includes components having one or more integrated circuit structures described herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802. Generally, components may be disposed on one or both faces 840 and 842. In particular, any suitable ones of the components of the IC device assembly 800 may include a number of contacts for thin film transistors patterned with a multilayer hardmask, such as disclosed herein.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804.

It is to be appreciated that additional interposers may be coupled to the interposer 804. The interposer 804 may provide an intervening substrate used to bridge the circuit board 802 and the IC package 820. The IC package 820 may be or include, for example, a die (the die 702 of FIG. 7B), or any other suitable component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 810 and vias 808, including but not limited to through-silicon vias (TSVs) 806. The interposer 804 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. The package-on-package structure 834 may be configured in accordance with any of the package-on-package structures known in the art.

Figure 9:
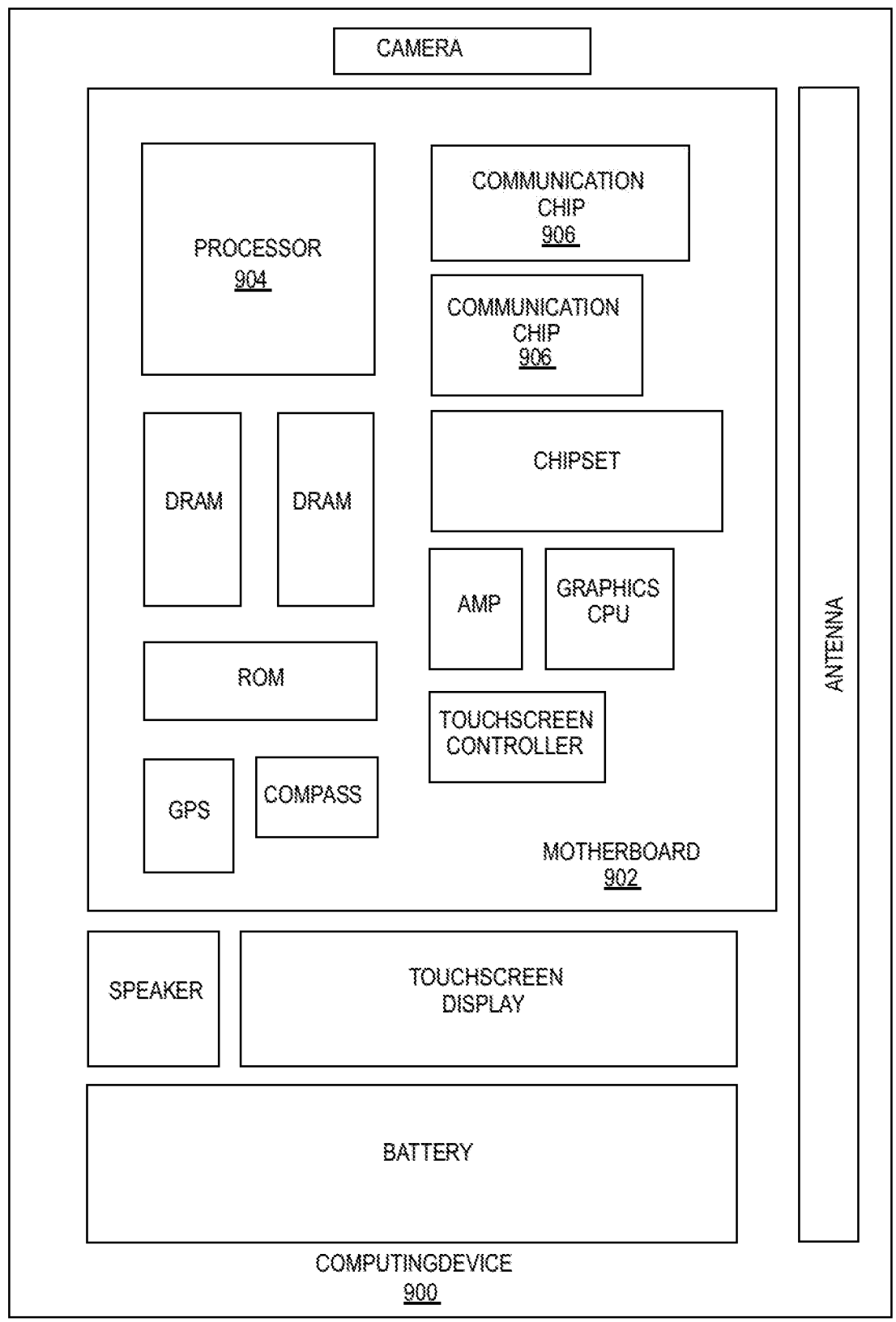
FIG. 9 is a diagram illustrating a computing device in accordance with one implementation of the disclosure.

FIG. 9 is a diagram illustrating a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes one or more contacts for thin film transistors patterned with a multilayer hardmask, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the disclosure, the integrated circuit die of the communication chip includes one or more contacts for thin film transistors patterned with a multilayer hardmask, in accordance with implementations of embodiments of the disclosure.

In further implementations, another component housed within the computing device 900 may contain an integrated circuit die that includes one or more contacts for thin film transistors patterned with a multilayer hardmask, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include contacts for thin film transistors patterned with a multilayer hardmask.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure comprises one or more backend-of-line (BEOL) interconnects formed over a first ILD layer. An etch stop layer is over the one or more BEOL interconnects, the etch stop layer having a plurality of vias that are in contact with the one or more BEOL interconnects. An array of BEOL thin-film-transistors (TFTs) is over the etch stop layer, wherein adjacent ones of the BEOL TFTs are separated by isolation trench regions. The TFTs are aligned with at least one of the plurality of vias to connect to the one or more BEOL interconnects, wherein each of the BEOL TFTs comprise a bottom gate electrode, a gate dielectric layer over the bottom gate electrode, and an oxide-based semiconductor channel layer over the bottom gate electrode having source and drain regions therein. Contacts are formed over the source and drain regions of each of BEOL TFTs, wherein the contacts have a critical dimension of 35 nm or less, and wherein the BEOL TFTs have an absence of diluted hydro-fluoride (DHF).

Example embodiment 2: The integrated circuit structure of example embodiment 1, wherein the oxide-based semiconductor channel layer comprises one of: tin oxide, antimony oxide, indium oxide, indium tin oxide, indium gallium zinc oxide (IGZO), titanium oxide, zinc oxide, indium zinc oxide, gallium oxide, titanium oxynitride, ruthenium oxide or tungsten oxide.

Example embodiment 3: The integrate circuit structure of example embodiment 1, wherein a pitch of the BEOL TFTs in a parallel-to-gate direction is approximately 120-150 nm.

Example embodiment 4: The integrate circuit structure of example embodiment 1, wherein a pitch of the BEOL TFTs in an orthogonal-to-gate direction is approximately 93-123 nm.

Example embodiment 5: The integrate circuit structure of example embodiment 1, wherein individual ones of the BEOL TFTs are approximately 95-125 nm in size in a parallel-to-gate direction.

Example embodiment 6: The integrate circuit structure of example embodiment 1, wherein individual ones of the BEOL TFTs are approximately 58-88 nm in size in an orthogonal-to-gate direction.

Example embodiment 7: The integrate circuit structure of example embodiment 1, wherein the BEOL TFTs are spaced apart in a parallel-to-gate direction by approximately 25 nm or less, and are spaced apart in an orthogonal-to-gate direction by approximately 35 nm or less.

Example embodiment 8: The integrate circuit structure of example embodiment 1, wherein the integrated circuit structure comprises an embedded dynamic random access memory (eDRAM).

Example embodiment 9: A method of fabricating a memory device, the method comprises forming one or more backend-of-line (BEOL) interconnects over a first ILD layer. An etch stop layer over the one or more BEOL interconnects, the etch stop layer having a plurality of vias that are in contact with the one or more BEOL interconnects. An array of BEOL thin-film-transistors (TFTs) is formed over the etch stop layer, wherein adjacent ones of the BEOL TFTs are separated by isolation trench regions, and wherein each of the TFTs are aligned with at least one of the plurality of vias to connect to the one or more BEOL interconnects, each of the BEOL TFTs comprising a bottom gate electrode, a gate dielectric layer over the bottom gate electrode, and an oxide-based semiconductor channel layer over the bottom gate electrode having source and drain regions therein. Contacts are formed over the source and drain regions of each of BEOL TFTs, wherein the contacts have a critical dimension of 35 nm or less, and wherein the BEOL TFTs have an absence of diluted hydro-fluoride (DHF).

Example embodiment 10: The method of example embodiment 9, wherein the oxide-based semiconductor channel layer comprises one of: tin oxide, antimony oxide, indium oxide, indium tin oxide, indium gallium zinc oxide (IGZO), titanium oxide, zinc oxide, indium zinc oxide, gallium oxide, titanium oxynitride, ruthenium oxide or tungsten oxide.

Example embodiment 11: The method of example embodiment 9, wherein a pitch of the BEOL TFTs in a parallel-to-gate direction is approximately 120-150 nm.

Example embodiment 12: The method of example embodiment 9, wherein a pitch of the BEOL TFTs in an orthogonal-to-gate direction is approximately 93-123 nm.

Example embodiment 13: The method of example embodiment 9, wherein individual ones of the BEOL TFTs are approximately 95-125 nm in size in a parallel-to-gate direction.

Example embodiment 14: The method of example embodiment 9, wherein individual ones of the BEOL TFTs are approximately 58-88 nm in size in an orthogonal-to-gate direction.

Example embodiment 15: The method of example embodiment 9, wherein the BEOL TFTs are spaced apart in a parallel-to-gate direction by approximately 25 nm or less, and are spaced apart in an orthogonal-to-gate direction by approximately 35 nm or less.

Example embodiment 16: The method of example embodiment 9, wherein the integrated circuit structure comprises an embedded dynamic random access memory (eDRAM).

Example embodiment 17: A method of fabricating a memory device comprises forming an array of backend-of-line (BEOL) thin film transistors (TFTs), the BEOL TFTs having an oxide channel. A multilayer hardmask is formed for contact patterning of the BEOL TFTs, where the multilayer hardmask comprises a metal hardmask and a dielectric hardmask having different etch selectivities. A litho-etch-litho-etch patterning is performed to enable two different etch bias tunings including, a first etch bias tuning for patterning the dielectric hardmask in an orthogonal-to-gate direction (OGD), and a second etch bias tuning for patterning the metal hardmask in a parallel-to-gate direction (PGD) to define contact hole locations. A contact open dry etch process is performed to remove the dielectric hardmask entirely, and to remove material in the contact hole locations down to the oxide channel to create contact holes. A wet clean process is performed to remove the metal hardmask entirely, wherein the wet clean is compatible with the oxide channel, such that the wet clean does not remove or damage the oxide channel. A metal fill and polish is performed over the contact holes to create contacts.

Example embodiment 18: The method of example embodiment 17 further comprising: patterning the metal hardmask to a thickness of approximately 10-35 nm, and patterning the dielectric hardmask to a thickness of approximately 10-30 nm.

Example embodiment 19: The method of example embodiment 17 further comprising: patterning the metal hardmask and the dielectric hardmask such that a number of material layers comprising the metal hardmask is different than a number of material layers comprising the dielectric hardmask.

Example embodiment 20: The method of example embodiment 17 wherein performing the litho-etch-litho-etch patterning further comprises: performing a first lithographic etch process to define a first pattern in the OGD to transfer to the dielectric hardmask; and performing a first contact dry etch process having a chemistry selective to the metal hardmask and non-selective to the dielectric hardmask to remove the dielectric hardmask over the contact hole locations in the OGD.

Example embodiment 21: The method of example embodiment 20 wherein performing the litho-etch-litho-etch patterning further comprises: performing a second lithographic etch process to define a second pattern in the PGD to transfer to the metal hardmask; and performing a second contact dry etch process having a chemistry selective to the dielectric hardmask and non-selective to the metal hardmask to remove the metal hardmask over the contact hole locations in the PGD.

Example embodiment 22: The method of example embodiment 17, wherein the oxide-based semiconductor channel layer comprises one of: tin oxide, antimony oxide, indium oxide, indium tin oxide, indium gallium zinc oxide (IGZO), titanium oxide, zinc oxide, indium zinc oxide, gallium oxide, titanium oxynitride, ruthenium oxide or tungsten oxide.

Example embodiment 23: The method of example embodiment 17, wherein a pitch of the BEOL TFTs in a parallel-to-gate direction is approximately 120-150 nm.

Example embodiment 24: The method of example embodiment 17, wherein a pitch of the BEOL TFTs in an orthogonal-to-gate direction is approximately 93-123 nm.

Example embodiment 25: The method of example embodiment 17, wherein the BEOL TFTs are spaced apart in a parallel-to-gate direction by approximately 25 nm or less, and are spaced apart in an orthogonal-to-gate direction by approximately 35 nm or less.

What is claimed is:
1. An integrated circuit structure, comprising:
one or more backend-of-line (BEOL) interconnects formed over a first ILD layer;
an etch stop layer over the one or more BEOL interconnects, the etch stop layer having a plurality of vias that are in contact with the one or more BEOL interconnects;
an array of BEOL thin-film-transistors (TFTs) over the etch stop layer, wherein adjacent ones of the BEOL

TFTs are separated by isolation trench regions, and wherein each of the TFTs are aligned with at least one of the plurality of vias to connect to the one or more BEOL interconnects, each of the BEOL TFTs comprising a bottom gate electrode, a gate dielectric layer over the bottom gate electrode, and an oxide-based semiconductor channel layer over the bottom gate electrode having source and drain regions therein; and contacts formed over the source and drain regions of each of BEOL TFTs.

2. The integrated circuit structure of claim 1, wherein the oxide-based semiconductor channel layer comprises one of: tin oxide, antimony oxide, indium oxide, indium tin oxide, indium gallium zinc oxide (IGZO), titanium oxide, zinc oxide, indium zinc oxide, gallium oxide, titanium oxynitride, ruthenium oxide or tungsten oxide.

3. The integrated circuit structure of claim 1, wherein a pitch of the BEOL TFTs in a parallel-to-gate direction is approximately 120-150 nm.

4. The integrated circuit structure of claim 1, wherein a pitch of the BEOL TFTs in an orthogonal-to-gate direction is approximately 93-123 nm.

5. The integrated circuit structure of claim 1, wherein individual ones of the BEOL TFTs are approximately 95-125 nm in size in a parallel-to-gate direction.

6. The integrated circuit structure of claim 1, wherein individual ones of the BEOL TFTs are approximately 58-88 nm in size in an orthogonal-to-gate direction.

7. The integrated circuit structure of claim 1, wherein the BEOL TFTs are spaced apart in a parallel-to-gate direction by approximately 25 nm, and are spaced apart in an orthogonal-to-gate direction by approximately 35 nm.

8. The integrated circuit structure of claim 1, wherein the integrated circuit structure comprises an embedded dynamic random access memory (eDRAM).

9. A method of fabricating a memory device, the method comprising:

forming one or more backend-of-line (BEOL) interconnects over a first ILD layer;

forming an etch stop layer over the one or more BEOL interconnects, the etch stop layer having a plurality of vias that are in contact with the one or more BEOL interconnects;

forming an array of BEOL thin-film-transistors (TFTs) over the etch stop layer, wherein adjacent ones of the BEOL TFTs are separated by isolation trench regions, and wherein each of the TFTs are aligned with at least one of the plurality of vias to connect to the one or more BEOL interconnects, each of the BEOL TFTs comprising a bottom gate electrode, a gate dielectric layer over the bottom gate electrode, and an oxide-based semiconductor channel layer over the bottom gate electrode having source and drain regions therein; and forming contacts over the source and drain regions of each of BEOL TFTs.

10. The method of claim 9, wherein the oxide-based semiconductor channel layer comprises one of: tin oxide, antimony oxide, indium oxide, indium tin oxide, indium gallium zinc oxide (IGZO), titanium oxide, zinc oxide, indium zinc oxide, gallium oxide, titanium oxynitride, ruthenium oxide or tungsten oxide.

11. The method of claim 9, wherein a pitch of the BEOL TFTs in a parallel-to-gate direction is approximately 120-150 nm.

12. The method of claim 9, wherein a pitch of the BEOL TFTs in an orthogonal-to-gate direction is approximately 93-123 nm.

13. The method of claim 9, wherein individual ones of the BEOL TFTs are approximately 95-125 nm in size in a parallel-to-gate direction.

14. The method of claim 9, wherein individual ones of the BEOL TFTs are approximately 58-88 nm in size in an orthogonal-to-gate direction.

15. The method of claim 9, wherein the BEOL TFTs are spaced apart in a parallel-to-gate direction by approximately 25 nm, and are spaced apart in an orthogonal-to-gate direction by approximately 35 nm.

16. The method of claim 9, wherein the integrated circuit structure comprises an embedded dynamic random access memory (eDRAM).

17. A method of fabricating a memory device, the method comprising:

forming an array of backend-of-line (BEOL) thin film transistors (TFTs), the BEOL TFTs having an oxide channel;

forming a multilayer hardmask for contact patterning of the BEOL TFTs, where the multilayer hardmask comprises a metal hardmask and a dielectric hardmask having different etch selectivities;

performing a litho-etch-litho-etch patterning to enable two different etch bias tunings including, a first etch bias tuning for patterning the dielectric hardmask in an orthogonal-to-gate direction (OGD), and a second etch bias tuning for patterning the metal hardmask in a parallel-to-gate direction (PGD) to define contact hole locations;

performing a contact open dry etch process to remove the dielectric hardmask entirely, and to remove material in the contact hole locations down to the oxide channel to create contact holes;

performing a wet clean process to remove the metal hardmask entirely, wherein the wet clean is compatible with the oxide channel, such that the wet clean does not remove or damage the oxide channel; and performing a metal fill and polish over the contact holes to create contacts.

18. The method of claim 17 further comprising:

patterning the metal hardmask to a thickness of approximately 10-35 nm, and patterning the dielectric hardmask to a thickness of approximately 10-30 nm.

19. The method of claim 17 further comprising:

patterning the metal hardmask and the dielectric hardmask such that a number of material layers comprising the metal hardmask is different than a number of material layers comprising the dielectric hardmask.

20. The method of claim 17 wherein performing the litho-etch-litho-etch patterning further comprises:

performing a first lithographic etch process to define a first pattern in the OGD to transfer to the dielectric hardmask; and performing a first contact dry etch process having a chemistry selective to the metal hardmask and non-selective to the dielectric hardmask to remove the dielectric hardmask over the contact hole locations in the OGD.

21. The method of claim 20 wherein performing the litho-etch-litho-etch patterning further comprises:

performing a second lithographic etch process to define a second pattern in the PGD to transfer to the metal hardmask; and performing a second contact dry etch process having a chemistry selective to the dielectric hardmask and non-selective to the metal hardmask to remove the metal hardmask over the contact hole locations in the PGD.

22. The method of claim 17, wherein the oxide-based semiconductor channel layer comprises one of: tin oxide, antimony oxide, indium oxide, indium tin oxide, indium gallium zinc oxide (IGZO), titanium oxide, zinc oxide, indium zinc oxide, gallium oxide, titanium oxynitride, ruthenium oxide or tungsten oxide.

23. The method of claim 17, wherein a pitch of the BEOL TFTs in a parallel-to-gate direction is approximately 120-150 nm.

24. The method of claim 17, wherein a pitch of the BEOL TFTs in an orthogonal-to-gate direction is approximately 93-123 nm.

25. The method of claim 17, wherein the BEOL TFTs are spaced apart in a parallel-to-gate direction by approximately 25 nm, and are spaced apart in an orthogonal-to-gate direction by approximately 35 nm.

* * * * *